United States Patent
Ozguc

[19]

[11] Patent Number: 6,037,811
[45] Date of Patent: Mar. 14, 2000

[54] CURRENT-CONTROLLED OUTPUT BUFFER

[75] Inventor: Ismail H. Ozguc, Sunnyvale, Calif.

[73] Assignee: International Microcircuits, Inc., Milpitas, Calif.

[21] Appl. No.: 09/097,886

[22] Filed: Jun. 15, 1998

Related U.S. Application Data

[60] Provisional application No. 60/061,696, Oct. 10, 1997, and provisional application No. 60/063,472, Oct. 10, 1997.

[51] Int. Cl.[7] .................................................. H03B 1/00
[52] U.S. Cl. ........................ 327/108; 327/112; 323/315; 326/87
[58] Field of Search ............................... 323/315; 326/86, 326/87; 327/108, 112, 389, 391, 170

[56] References Cited

U.S. PATENT DOCUMENTS

| | | | |
|---|---|---|---|
| 4,634,894 | 1/1987 | Shu et al. | 327/537 |
| 4,791,326 | 12/1988 | Vajdic et al. | 327/391 |
| 5,241,227 | 8/1993 | Jung et al. | 327/553 |
| 5,353,028 | 10/1994 | De Wit et al. | 341/172 |
| 5,625,306 | 4/1997 | Tada | 327/112 |
| 5,672,993 | 9/1997 | Runaldue | 327/404 |
| 5,801,564 | 9/1998 | Gasparik | 327/170 |
| 5,898,326 | 4/1999 | Okayasu | 327/112 |

*Primary Examiner*—Kenneth B. Wells
*Assistant Examiner*—An T. Luu
*Attorney, Agent, or Firm*—Townsend and Townsend and Crew LLP

[57] ABSTRACT

A current-controlled output buffer circuit includes a control circuit, a charging circuit, and a discharging circuit. The control circuit is configured to receive a control signal, and in response produces a charging signal and a discharging signal. The charging circuit is configured to receive the charging signal and in response, supplies a charging current to an output terminal, the magnitude of said charging current producing a signal rise time. The discharging circuit is configured to receive the discharging signal and in response, sinks a discharging current from the output terminal, the magnitude of the discharging current producing a signal fall time.

20 Claims, 3 Drawing Sheets

CURRENT-CONTROLLED OUTPUT BUFFER

CROSS-REFERENCE TO RELATED APPLICATIONS

This application claims priority from the following U.S. Provisional Applications, the disclosure of which are incorporated by reference in their entirety for all purposes:

Application No. 60/061,696, filed Oct. 10, 1997, of Ismail H. Ozguc, entitled "ADAPTIVE DRIVER WITH CAPACITIVE LOAD SENSING"; and Application No. 60/063,472, filed Oct. 10, 1997, of Ismail H. Ozguc, entitled "CURRENT CONTROLLED OUTPUT BUFFER".

BACKGROUND OF THE INVENTION

The present invention relates in general to integrated circuits and in particular to an output driver or buffer circuit with current-controlled output rise and fall times.

In certain applications, an electronic system may require an integrated circuit (IC) to drive other circuitry that present variable load conditions. Output driver circuits have been designed that provide variable drive capability. One known approach, for example, is to switch in or out one or more output transistors in parallel to vary the current drive of the output buffer. This technique, however, usually requires more transistors with various sizes than the minimum size may require, which is costly. Further, connecting more transistors to the output node by itself often results in varying the output load. This approach is also sensitive to timing constraints.

There is a need for an output driver circuit that can provide variable drive capability while maintaining accurate control over rise and fall times of the output signal.

SUMMARY OF THE INVENTION

The present invention provides method and circuitry for controlling the output load current of an output driver circuit throughout the rise and fall time of the output signal. In one embodiment, the current-controlled output buffer circuit includes a control circuit, a charging circuit, and a discharging circuit. The control circuit is configured to receive a control signal, and in response produces a charging signal and a discharging signal. The charging circuit is configured to receive the charging signal and in response, supplies a charging current to an output terminal; the magnitude of the charging current produces a signal rise time. The discharging circuit is configured to receive the discharging signal and in response, sinks a discharging current from the output terminal. The magnitude of the discharging current produces a signal fall time.

DESCRIPTION OF THE PREFERRED EMBODIMENT

Figure 1:
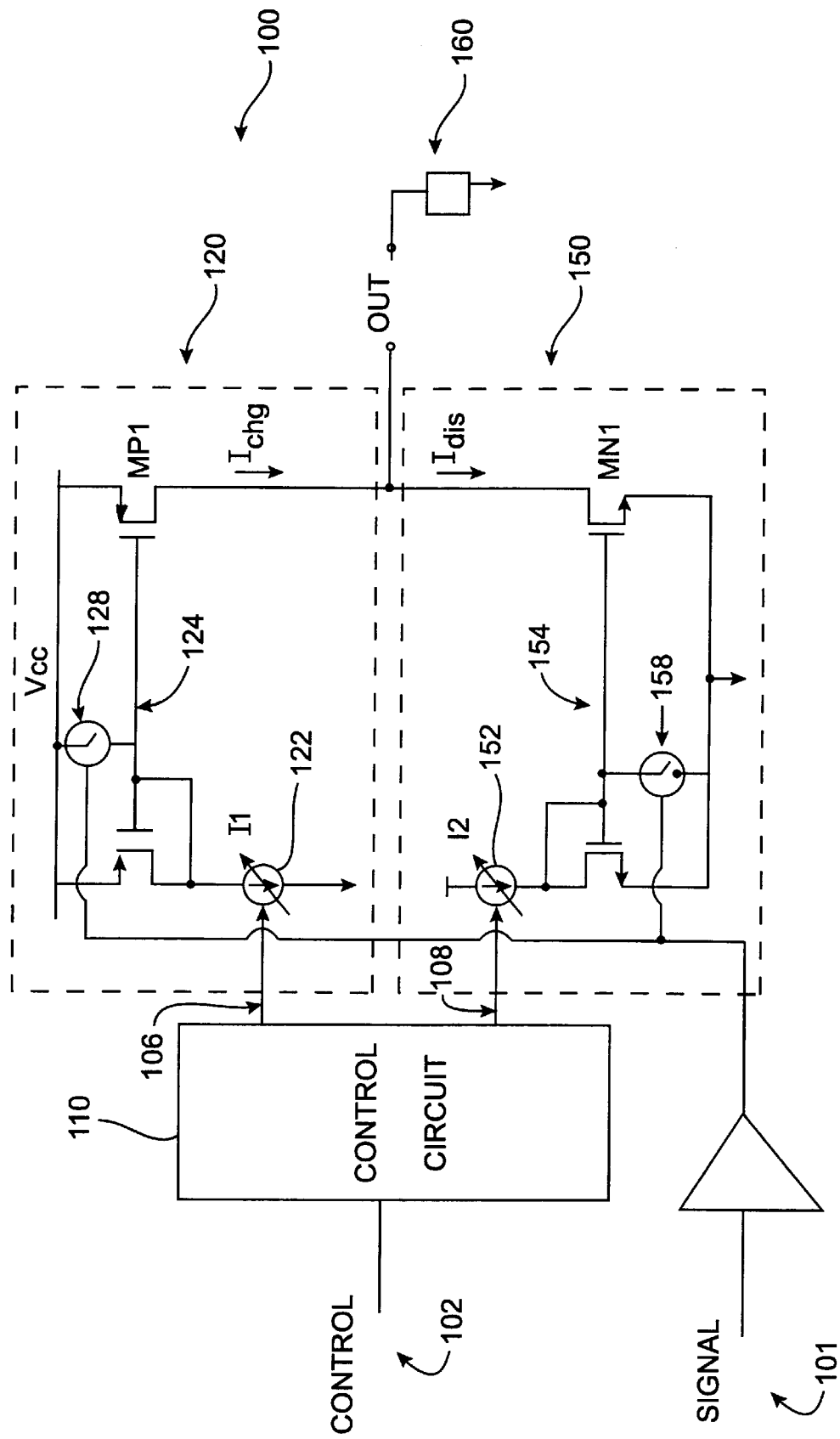
FIG. 1 is a simplified block diagram of the current-controlled output driver circuit according to one embodiment of the present invention.

FIG. 1 illustrates a simplified block diagram of a current-controlled output driver circuit 100 according to one embodiment of the present. The current-controlled output driver 100 includes a control circuit 110, a charging circuit 120 and a discharging circuit 150. The charging circuit 120 includes a first adjustable current source 122, a first current mirror 124, and a switch 128. The discharging circuit includes a second adjustable current source 152, a second current mirror 154, and a switch 158.

In operation, the control circuit 110 receives a control signal 102, and in response, produces a charging signal 106 and a discharging signal 108. The charging signal 106 is supplied to the first adjustable current source 122 which produces a first reference current $I_1$. The first reference current $I_1$ is mirrored to a charging transistor MP1 to supply a charging current $I_{chg}$ to the OUT terminal.

The discharging circuit 150 operates in a similar manner. The second adjustable current source 152 receives the discharging signal 108 and produces second reference current $I_2$. The second reference current $I_2$ is mirrored to a discharging transistor MN1 to sink (remove) a discharging current $I_{dis}$ from the load 160 coupled to OUT terminal.

An input signal 101 controls switches 128 and 158 to alternately activate the charging and discharging transistors MP1 and MN1. When the input signal 101 is high, switch 128 is turned off, allowing the charging transistor MP1 to conduct. Switch 158 is simultaneously turned on, pulling the gate terminal of the discharging transistor MN1 to ground, rendering it non-conductive. Thus, $I_{chg}$ supplied by transistor MP1 flows out of the circuit 100 and into the load impedance 160. The voltage developed across the load 160 during the high input signal level state will have a rise time proportional to the amount of current $I_{chg}$ delivered.

The circuit 100 operates in the opposite fashion when the input signal 101 is low. The low input signal 101 turns switch 128 on, rendering the charging transistor MP1 non-conductive, while simultaneously turning switch 158 off, allowing the discharging transistor MN1 to conduct. Thus, $I_{dis}$ flows from the load impedance 160 to ground through the discharging transistor MN1. The voltage developed across the load 160 during the low input signal level state will have a fall time proportional to the amount of current $I_{dis}$ sunk by transistor MN1. Thus, the charging and discharging signals 106 and 108 are used to independently control the rise and fall times of the output signal.

Figure 2:
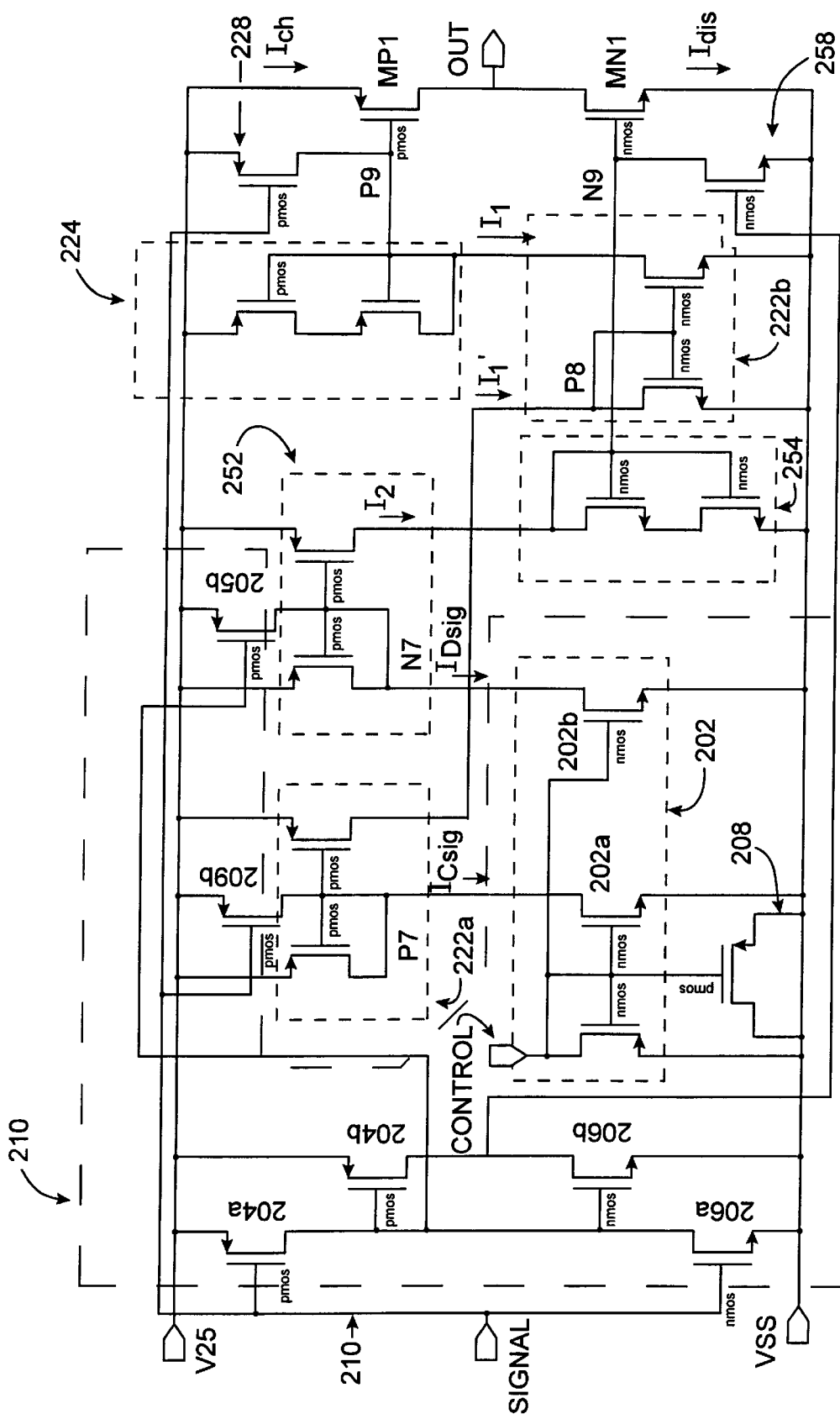
FIG. 2 is an exemplary circuit implementation of the current-controlled output driver circuit of the present invention.

FIG. 2 provides an exemplary circuit implementation of the present invention. The circuit includes a control circuit 210, a charging circuit and a discharging circuit. The control circuit 210 includes a current mirror 202, control transistors 204, 205, and 206, and a filtering capacitively-coupled transistor 208. The charging circuit includes a first adjustable current source 222, a current mirror 224, an output stage control transistor 228, and a charging transistor MP1. The discharging circuit includes a second adjustable current source 252, a current mirror 254, an output stage control transistor 258, and a discharging transistor MN1. In the preferred embodiment, the charging and discharging transistors MP1 and MN1 are PMOS and NMOS FET transistors, respectively, as shown. In alternative embodiments, one or both of the charging and discharging transistors MP1 and MN1 may be realized as multiple parallel-connected transistors and may be constructed in FET, BJT, or other transistor architectures. In this exemplary embodiment, the low supply rail is 0 V and the high supply rail is 2.5 V. Also preferred is a noise reduction capacitor 208 coupled to the gate terminal of the current source 202.

When the input signal (at SIGNAL) makes a rising transition, the NMOS transistor 206a is switched on. The NMOS transistor 206a pulls node INPB low, turning on transistors 204b and 205b on. Activated PMOS transistor 205b switches the adjustable current source 252 in the discharging circuit off. With a low signal at its gate, PMOS transistor 204b turns on, pulling node INPBB high. With INPBB at a high level, switch transistor 258 turns on, thereby turning the discharge transistor MN1 off. Transistors 205a and 228 are switched off when SIGNAL is high, allowing the charging circuit (222a, 222b, 224, and MP1) to supply the charging current $I_{chg}$ to the load 160. Thus, the rise time of the output signal at OUT is defined by the magnitude of the charging current $I_{chg}$ which is adjusted by the signal at the CONTROL terminal.

The circuits operate in the opposite manner when SIGNAL makes a falling transition, activating the discharging circuit while deactivating the charging circuit. When activated, the discharging circuit (252, 254, and MN1) sinks the discharging current $I_{dis}$ from the load 160, which defines the fall time of the output signal OUT.

In the preferred embodiment, the magnitude of the currents $I_{chg}$ and $I_{dis}$ are set by a series of current mirrors. Referring again to FIG. 2, a first current mirror 202 within the control circuit 210 produces a charging signal and a discharging signal in the form of currents $I_{csig}$ and $I_{dsig}$. The magnitudes of currents $I_{csig}$ and $I_{dsig}$ are set by the signal CONTROL and the sizes of the two transistors 202a and 202b. The currents $I_{csig}$ and $I_{dsig}$ are sunk from the adjustable current sources 222 and 252 of the charging and discharging circuits, respectively.

The adjustable current source 252 responds to the discharge signal $I_{dsig}$ by supplying the second reference current $I_2$ to a second current mirror 254 of cascode configuration. Accordingly, a current $I_{dis}$ in the amount of $K*I_2$ is sunk from the output terminal via discharging transistor MN1, where K (e.g., 64) is the ratio between the gate sized of MN1 and the cascode configuration of the current source 254. The amount of current sunk from the output terminal determines the fall time of the output signal. Thus, the output signal fall time is controlled by $I_{dis}$, which is, in turn determined by the magnitude of the discharging signal $I_{dsig}$ and gate sizes of current source 202, the adjustable current source 252, and the discharging transistor MN1.

The charging circuit of FIG. 2 closely parallels the structure and operation of the discharging circuit, the exception being that the adjustable current source 222 includes two current mirrors 222a and 222b. The first current mirror 222a in the preferred embodiment is identical in structure and operation to the adjustable current source 252 of the discharging circuit. The second current mirror 222b is used to provide additional variability and control over the rise time of the output signal. By implementing an additional current source in the charging circuit, the charging and discharging circuits can be designed to supply and sink different amounts of current to and from the output load while receiving the same control signal ($I_{csig}=I_{dsig}$). In this way, independent control of the rise and fall times can be achieved. The charging and discharging circuits may be designed symmetrically so that the charging and discharging currents $I_{chg}$ and $I_{dis}$ are substantially equal, resulting in symmetrical rise and fall times.

The first current mirror 222a of the adjustable current source 222 responds to the charging signal $I_{csig}$ by supplying a current $I_1'$ to the second current mirror 222b. The second current mirror 222b receives the current $I_1'$ and sinks the first reference current $I_1$ from a current mirror 224 of cascode configuration. A current $I_{chg}$ in the amount of $K*I_1$ is supplied to the output terminal via charging transistor MP1, where K (e.g., 64) is the ratio between the gates sizes of MP1 and the cascode configuration of the current source 224. The amount of current supplied to the output terminal determines the rise time of the output signal. Thus, the output signal rise time is controlled by $I_{chg}$, which is, in turn determined by the magnitude of the charging signal $I_{csig}$ and the selection of gate sizes of current source 202, the adjustable current source 222, and the discharging transistor MP1.

Figure 3:
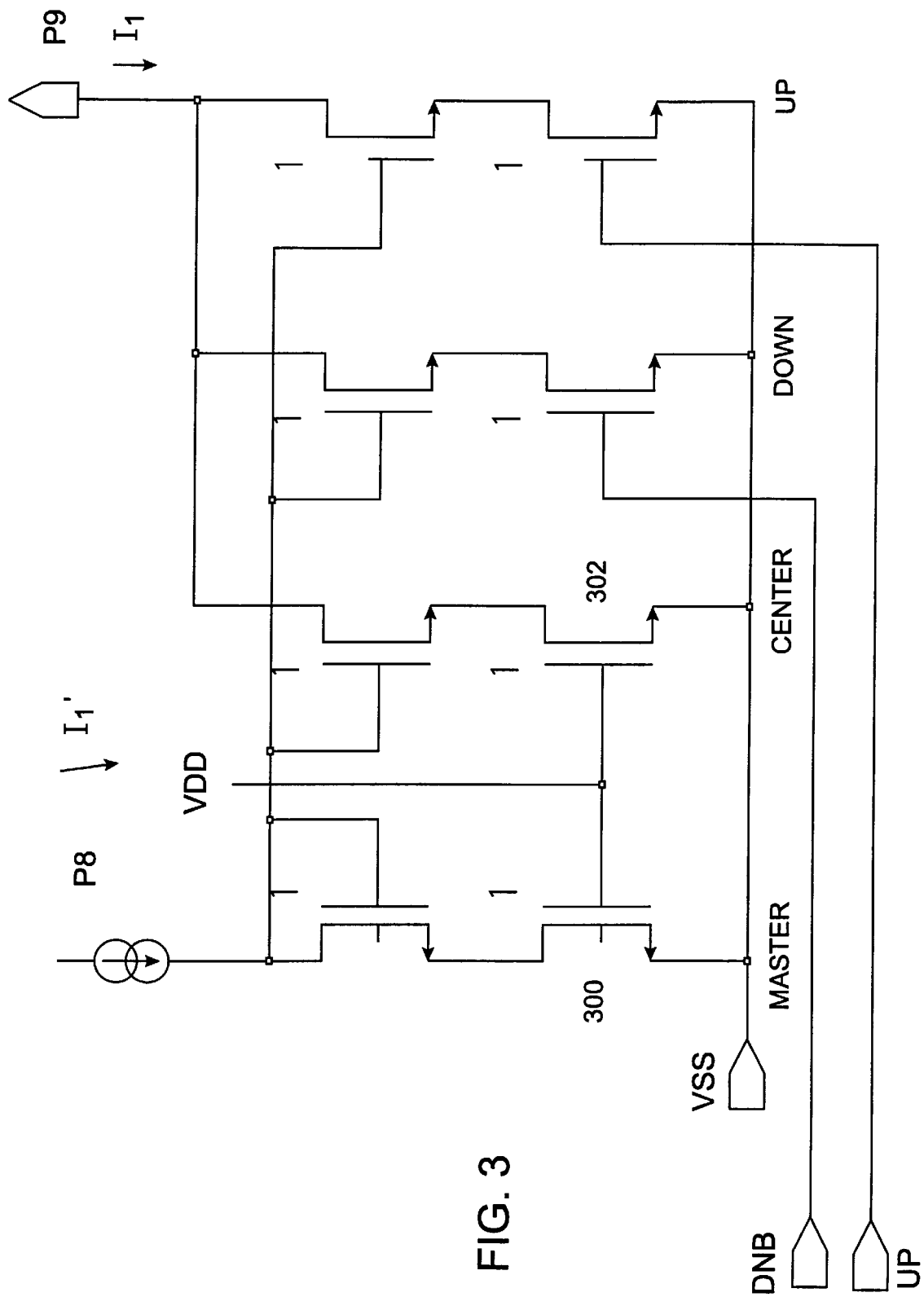
FIG. 3 illustrates one embodiment of the adjustable current source in accordance with the present invention.

FIG. 3 illustrates a second embodiment of the second current mirror 222b of the charging circuit's adjustable current source. In this embodiment, the current mirror 300 includes four cascode pairs of NMOS FETs, preferably of similar size. Nodes P8 and P9 and currents $I_1'$ and $I_1$ are as indicated in FIG. 2. A source supply voltage VSS (e.g., 0 V) is connected to the FET source terminals.

The first cascode pair MASTER sinks $I_1'$ from node P8 as shown in FIG. 2. The second cascode pair CENTER sinks a portion of the total first reference current $I_1$ as shown in FIG. 2. The cascode transistors 300 and 302 MASTER and CENTER cascode FET pairs remain on by connecting their gates to the high supply voltage.

The third cascode pair DOWN further contributes to the first reference current $I_1$ when a high signal is applied to the DNB terminal. In the preferred embodiment, activation of both the CENTER and DOWN FET pairs provides a 2:1 current multiplication factor between $I_1'$ and $I_1$. If a longer rise time and consequently, smaller $I_{chg}$ is desired, $I_1$ can be decreased by replacing the high signal at DNB with a low signal, thereby switching the DOWN cascode FET pair off. The programming of the DNB terminal can be accomplished by a variety of methods including wire bonding to a pad connected to DNB, using metal mask options or using programmable elements (e.g., fusible links, reprogrammable memory cell, etc.)

The fourth cascode pair UP also contributes to the first reference current $I_1$ when a high signal is applied to the UP terminal. During normal operation, the UP terminal is held low to provide a 2:1 current multiplication between $I_1'$ and $I_1$. If a shorter rise time and accordingly a larger $I_{chg}$, the UP cascode pair can be activated. Thus, in the manner described above, the current $I_1$, and accordingly, the rise time can be adjusted up or down. The same or similar circuit could be implemented in the discharging circuit to provide control over the desired fall time of the output signal as well.

While the above description is complete with regards to the preferred embodiments of the invention, other variations, modifications and equivalents will be evident to those skilled in the art. For example, in the exemplary embodiments described, transistors 202a and 202b have substantially the same gate sizes so that $I_{csig}=I_{dsig}$. Other embodiments are possible wherein the two transistors have substantially different gate sizes to sink different amounts of current in the charging and discharging circuits. Therefore, the above description is not intended to define the complete scope of the invention, which is appropriately defined by the following claims.

What is claimed is:

1. A current-controlled output buffer circuit having an input and an output, comprising:

a control circuit having a control signal input port, a charging signal output port, and a discharging signal output port; a charging circuit having a charging signal input coupled to said charging signal output port, said charging circuit configured to supply a variable charging current to the buffer output in response to a charging signal on said charging signal input port, the magnitude of said variable charging current setting a signal rise time at the buffer output; and a discharging circuit having a discharging signal input coupled to said discharging signal output port, said discharging circuit configured to sink a variable discharging current from the buffer output in response to a discharging signal on said discharging signal input, the magnitude of said variable discharging current setting a signal fall time at the buffer output, wherein said signal rise time can be adjusted independently of said signal fall time.

2. The current-controlled output buffer circuit of claim 1, wherein said control circuit comprises a first current mirror coupled to said control signal input port, said first current mirror having a discharging signal current output and a charging signal current output.

3. The current-controlled output buffer circuit of claim 2, wherein said charging circuit comprises:

a first adjustable current source having an input coupled to said charging current output of said first current mirror and an output, said first adjustable current source configured to generate a first reference current in response to a charging current signal on said charging current output; and a charging output stage coupled to said first adjustable current source output, said charging output stage configured to supply said charging current to said buffer output in response to said first reference current.

4. The current-controlled output buffer circuit of claim 3, wherein said first adjustable current source comprises:

a second current mirror having a first port coupled to receive said charging current output of said first current mirror and a second port, said second current mirror configured to supply an intermediate current at said second port in response to said charging current signal; and a third current mirror having an input coupled to said second current mirror output and an output coupled to said charging output stage, said third current mirror configured to sink said first reference current in response to sinking said intermediate current from said second current mirror.

5. The current-controlled output buffer circuit of claim 4, wherein said charging output stage comprises:

a fourth current mirror configured to supply said first reference current to said third current mirror; and a charging transistor coupled to said fourth current mirror, wherein said fourth current mirror controls said charging transistor to supply said charging current to said output buffer in response to said charging stage supplying said first reference current to said third current mirror.

6. The current-controlled output buffer circuit of claim 5, wherein said charging circuit further comprises a switching transistor having a gate terminal coupled to a signal input terminal, a source terminal coupled to a high supply, and a drain terminal coupled to a gate terminal of said charging transistor.

7. The current-controlled output buffer circuit of claim 2, wherein said charging circuit comprises:

a second adjustable current source having an input coupled to said discharging current output of said first current mirror and an output, said second adjustable current source configured to generate a second reference current in response to a discharging current signal on said discharging current output; and a discharging output stage coupled to said second adjustable current source output, said discharging output stage configured to sink said discharging current to said output buffer in response to supplying said second reference current to said second adjustable current source.

8. The current-controlled output buffer circuit of claim 7, wherein said second adjustable current source comprises a fifth current mirror having an input coupled to said discharging current output of said first current mirror and an output, said fifth current mirror configured to supply said second reference current to said discharging output stage in response to supplying said discharging signal current to said first current mirror.

9. The current-controlled output buffer circuit of claim 4, wherein said discharging output stage comprises:

a sixth current mirror configured to sink said second reference current from said fifth current mirror; and a discharging transistor coupled to said sixth current mirror, wherein said sixth current mirror controls said discharging transistor to sink said discharging current from said output buffer in response to said discharging output stage sinking said second reference current from said fifth current mirror.

10. The current-controlled output buffer circuit of claim 9, wherein said discharging circuit further comprises a switching transistor having a gate terminal coupled to a signal input terminal, a source terminal coupled to a low supply, and a drain terminal coupled to a gate terminal of said discharging transistor.

11. The current-controlled output buffer circuit of claim 2, wherein said first current mirror comprises:

a first FET having a gate terminal and a drain terminal coupled to said control signal input port and a source terminal coupled to a low supply;

a second FET having a gate terminal coupled to said gate terminal of said first FET, a drain terminal coupled to said charging signal port, and a source terminal coupled to said low supply; and a third FET having a gate terminal coupled to said gate terminal of said first FET, a drain terminal coupled to said discharging signal output port, and a source terminal coupled to said low supply.

12. The current-controlled output buffer circuit of claim 11, wherein said control circuit further comprises a fourth FET having a gate terminal coupled to a signal input terminal, a source terminal coupled to a high supply, and a drain terminal;

a fifth FET having a gate terminal coupled to said gate terminal of said fourth FET, a drain terminal coupled to said drain terminal of said fourth FET, and a source terminal coupled to said low supply;

a sixth FET having a gate terminal coupled to said drain terminal of said fourth FET, a source terminal coupled to said high supply, and a drain terminal; and a seventh FET having a gate terminal coupled to said drain terminal of said fifth FET, a drain terminal coupled to said drain terminal of said sixth FET, and a source terminal coupled to said low supply.

13. The current-controlled output buffer circuit of claim 4, wherein said second current mirror comprises:

an eighth FET having a gate terminal and a drain terminal coupled together and a source terminal coupled to a high supply;

a ninth FET having a gate terminal coupled to said gate terminal of said eighth FET, a source terminal coupled to said high supply, and a drain terminal coupled to said third current mirror; and a tenth FET having a gate terminal coupled to said signal input, a source terminal coupled to said high supply voltage, and a drain terminal coupled to said gate terminals of said eighth and ninth FETS.

14. The current-controlled output buffer circuit of claim 4, wherein said third current mirror comprises:

an eleventh FET having a gate terminal and a drain terminal coupled together and to said second current mirror and a source terminal coupled to said low supply; and a twelfth FET having a gate terminal coupled to said gate terminal of said eleventh FET, a source terminal coupled to said low supply, and a drain terminal coupled to said charging output stage.

15. The current-controlled output buffer circuit of claim 4, wherein said third current mirror comprises:

a first cascode FET pair comprising:
　a thirteenth FET having a gate terminal and a drain terminal coupled together and to said second current mirror and a source terminal;
　a fourteenth FET having a gate terminal coupled to said high supply, a drain terminal coupled to said source terminal of said thirteenth FET, and a source terminal coupled to said low supply;

a second cascode FET pair comprising:
　a fifteenth FET having a gate terminal coupled to said gate terminal of said thirteenth FET, a drain terminal coupled to said output charging stage, and a source terminal;
　a sixteenth FET having a gate terminal coupled to said high supply, a drain terminal coupled to said source terminal of said fifteenth FET, and a source terminal coupled to said low supply;

a third cascode FET pair comprising:
　a seventeenth FET having a gate terminal coupled to said gate terminal of said thirteenth FET, a drain terminal coupled to said output charging stage, and a source terminal;
　an eighteenth FET having a gate terminal, a drain terminal coupled to said output charging stage, and a source terminal coupled to said low supply; and a fourth cascode FET pair comprising:
　a nineteenth FET having a gate terminal coupled to said gate terminal of said thirteenth FET, a drain terminal coupled to said output charging stage, and a source terminal; and
　an twentieth FET having a gate terminal, a drain terminal coupled to said source terminal of said seventeenth FET, and a source terminal coupled to said low supply.

16. The current-controlled output buffer circuit of claim 8, wherein said fifth current mirror comprises:

an twenty-first FET having a gate terminal and a drain terminal coupled together and a source terminal coupled to a high supply;

a twenty-second FET having a gate terminal coupled to said gate terminal of said eighth FET, a source terminal coupled to said high supply, and a drain terminal coupled to said third current mirror; and a twenty-third FET having a gate terminal coupled to said drain terminal of said fourth FET, a source terminal coupled to said high supply voltage, and a drain terminal coupled to said gate terminals of said twenty-first and twenty-second FETs.

17. A method for driving an output terminal comprising the steps of generating a variable charging current;

generating a variable discharging current that is substantially independent of said variable charging current;

supplying said variable charging current to the output terminal via a first current mirror circuit; and sinking said variable discharging current from said output terminal via a second current mirror circuit whereby, a signal rise time and a signal fall time at the output terminal can be independently adjusted by said variable charging current and variable discharging current respectively.

18. The method of claim 17 further comprising the steps of:

turning off the first current mirror circuit when performing the sinking step; and turning off the second current mirror circuit when performing the supplying step.

19. An output buffer circuit for driving an output terminal, comprising:

a charging output transistor coupled to the output terminal;

a discharging output transistor coupled to the output termiinal;

a first variable current source coupled to the charging output transistor and configured to vary a charging current of the charging output transistor in response to a first control signal;

a second variable current source coupled to the discharging output transistor and configured to vary a discharging current of the discharging output transistor in response to a second control signal; and a control circuit coupled to the first and second variable current sources, and configured to generate the first and second control signals.

20. The output buffer circuit of claim 19 further comprising:

a first switch coupled to the charging output transistor; and a second switch coupled to the discharging output transistor, wherein, the first and second switches operate to turn one of the charging and discharging output transistors on and the other one off in response to an input signal.

\* \* \* \* \*